(12) United States Patent
Huang et al.

(10) Patent No.: US 10,192,825 B1
(45) Date of Patent: Jan. 29, 2019

(54) SEMICONDUCTOR DEVICE

(71) Applicant: UNITED MICROELECTRONICS CORP., Hsinchu (TW)

(72) Inventors: Wei-Hao Huang, New Taipei (TW); Chun-Lung Chen, Tainan (TW); Kun-Yuan Liao, Hsinchu (TW); Ying-Chih Lin, Tainan (TW); Chia-Lin Lu, Taoyuan (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 0 days.

(21) Appl. No.: 15/823,714

(22) Filed: Nov. 28, 2017

(30) Foreign Application Priority Data

Oct. 31, 2017 (CN) .......................... 2017 1 1047374

(51) Int. Cl.
*H01L 23/528* (2006.01)
*H01L 27/088* (2006.01)

(52) U.S. Cl.
CPC ...... *H01L 23/5283* (2013.01); *H01L 27/0886* (2013.01)

(58) Field of Classification Search
None
See application file for complete search history.

(56) References Cited

U.S. PATENT DOCUMENTS

| 9,589,899 | B2* | 3/2017 | Jun ....................... H01L 23/535 |
| 9,704,862 | B2 | 7/2017 | Park et al. | |
| 9,735,157 | B1* | 8/2017 | Chun ..................... H01L 23/528 |
| 2016/0086947 | A1* | 3/2016 | Park ....................... H01L 27/092 257/369 |
| 2016/0133522 | A1* | 5/2016 | Kang ................ H01L 21/76895 438/283 |
| 2016/0329314 | A1 | 11/2016 | Kang et al. | |
| 2017/0148727 | A1 | 5/2017 | Do et al. | |

* cited by examiner

*Primary Examiner* — Benjamin P Sandvik
(74) *Attorney, Agent, or Firm* — WPAT, PC

(57) ABSTRACT

A semiconductor device includes a first gate line, a second gate line and a first bar-shaped contact structure. The first gate line has a first long axis extending along a first direction. The second gate line is parallel to the first gate line. The first bar-shaped contact structure has a second axis forming an angle substantially greater than 0° and less than 90° with the first long axis.

17 Claims, 9 Drawing Sheets

SEMICONDUCTOR DEVICE

This application claims the benefit of People's Republic of China application Serial No. 201711047374.9, filed Oct. 31, 2017, the subject matter of which is incorporated herein by reference.

BACKGROUND

Technical Field

The disclosure relates in generally to a semiconductor device and more particularly to a semiconductor device having a gate contact structure.

Description of the Related Art

As the evolution of semiconductor process, a semiconductor integrated circuit (IC) with higher driving current and reaction speed as well as smaller critical size is required. In order to shrink the critical dimension (CD) of the semiconductor device and increase its reaction speed. A fin field effect transistor (fin field effect transistor, FinFET) technology has been applied to provide a semiconductor device with higher functional density, lower power consumption and improved gate control over the channel potential.

However, as the CD of the semiconductor device continue to shrink; the landing area of a contact structure that is used to provide an inter-layer connection in the semiconductor device is also shrank. The difference between an after-development-inspection (ADI) CD and an after-etching-inspection (AEI) CD during the process for fabrication the contact structure may be thus increased, and critical dimension uniformity (CDU) thereof can be deteriorated. This may cause connection failure between the gate of the FinFET and the contact structure; and the yield of the FinFET may be decreased significantly.

Therefore, there is a need of providing an improved semiconductor device to obviate the drawbacks encountered from the prior art.

SUMMARY

One aspect of the present disclosure is to provide a semiconductor device, wherein the semiconductor device includes a first gate line, a second gate line and a bar-shaped contact structure. The first gate line has a first long axis extending along a first direction. The second gate line is parallel to the first gate line. The bar-shaped contact structure has a second axis forming an angle substantially greater than 0° and less than 90° with the first long axis.

Another aspect of the present disclosure is to provide a semiconductor device, wherein the semiconductor device includes a semiconductor substrate, a first gate line, a second gate line and a bar-shaped contact structure. The first gate line is disposed on the substrate and has a first long axis extending along a first direction. The second gate line is disposed on the substrate and parallel to the first gate line. The bar-shaped contact structure is disposed on and electrically contacting with the first gate line and the second gate line, wherein the bar-shaped contact structure has a second axis forming an angle substantially greater than 0° and less than 90° with the first axis.

In accordance with the aforementioned embodiments of the present disclosure, a semiconductor device is provided in which a bar-shaped contact structure is applied electrically contacting to two parallel gate lines underlying thereof, wherein the bar-shaped contact structure has a long axis forming an angle greater than 0° and less than 90° with the long axis of the two parallel gate lines respectively. By this arrangement, the contacting area of the contact structure landing on the top surfaces of these two gate lines can be enlarged without increasing the pitch (width) of these two gate lines. As a result, the connection reliability between the bar-shaped contact structure and these two gate lines can be improved and the yield of the semiconductor device can be also increased.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1:
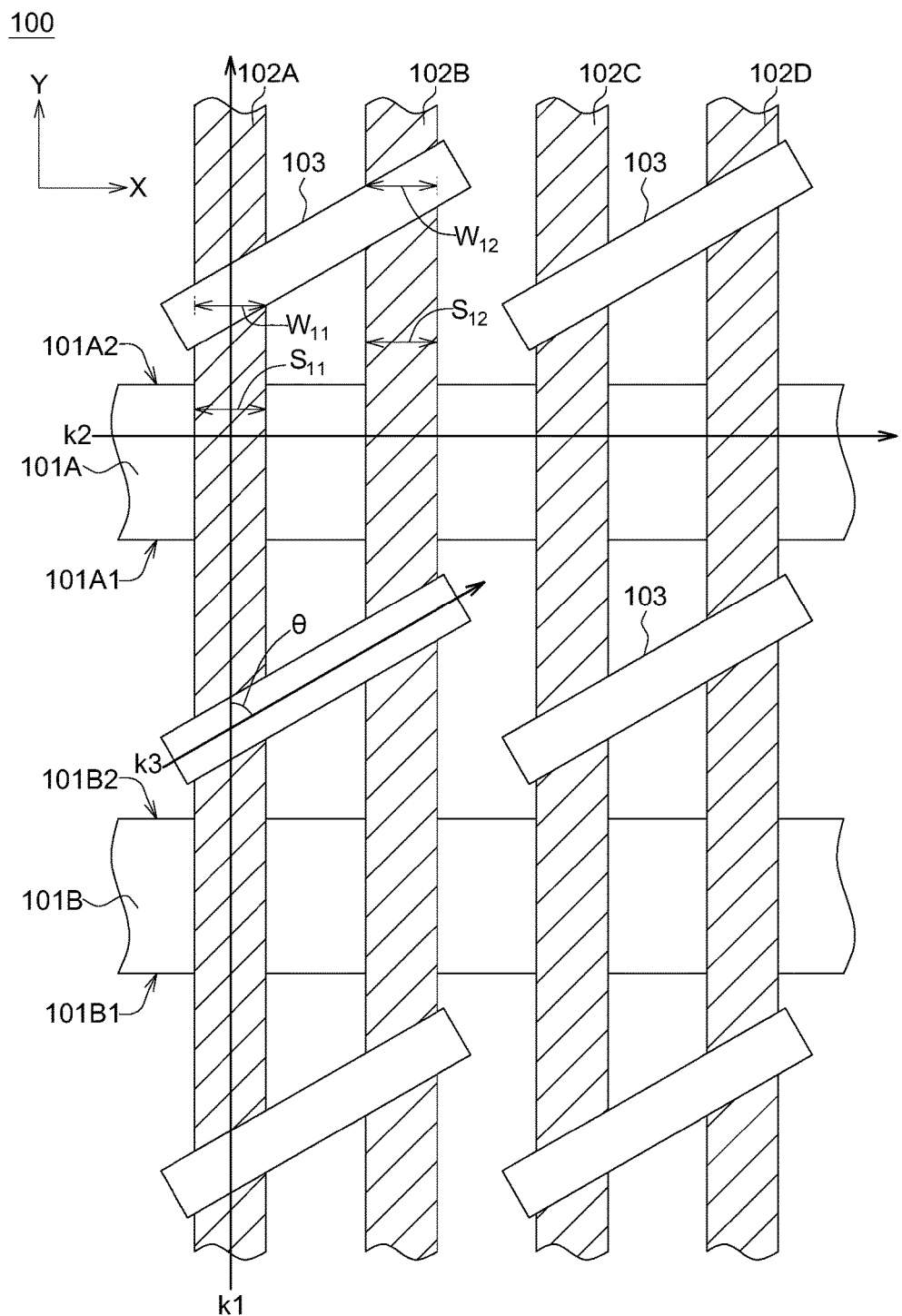
FIG. 1 is a top view illustrating a partial layout of a semiconductor device in accordance with one embodiment of the present disclosure.

The embodiments as illustrated below provide a semiconductor device to improve the reliability and the yield thereof which may be deteriorated by critical dimension shrinkage in prior art. The present disclosure will now be described more specifically with reference to the following embodiments illustrating the structure and arrangements thereof.

It is to be noted that the following descriptions of preferred embodiments of this disclosure are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily drawn to scale, and the identical elements of the embodiments are designated with the same reference numerals.

FIG. 1 is a top view illustrating a partial layout of a semiconductor device 100 in accordance with one embodiment of the present disclosure. The semiconductor device 100 includes a plurality of semiconductor fins (such as the semiconductor fins 101A and 101B), a plurality of gate lines (such as the gate lines 102A, 102B, 102C and 102D) and a plurality of bar-shaped contact structures 103.

In some embodiments of the present disclosure, the gate lines 102A, 102B, 102C and 102D are parallel to each other and intersect with the semiconductor fins 101A and 101B respectively. In the present embodiment, each of the gate lines 102A, 102B, 102C and 102D (e.g. the gate line 102A) has a long axis K1 extending along a first direction (e.g. along the extending direction of Y axis). The semiconductor fin 101A (or 101B) has a long axis K2 extending along the extending direction of X axis (i.e. a direction perpendicular to the first direction). In other words, each of the gate lines 102A, 102B, 102C or 102D vertically comes across over the semiconductor fins 101A and 101B, and extends beyond the two sides 101A1 and 101A2 of the semiconductor fin 101A and the two sides 101B1 and 101B2 of the semiconductor fins 101B parallel to the long axis K2 thereof.

However, it should be appreciated that, although the long axis K1 of the gate lines 102A, 102B, 102C and 102D (e.g. the gate line 102A) and the long axis K2 of the semiconductor fins 101A and 101B (e.g. the semiconductor fin 101A) as depicted in FIG. 1 are perpendicular with each other; the arrangement of the gate lines 102A, 102B, 102C and 102D and the semiconductor fins 101A and 101B may not limited as this regard. In some other embodiments of the present disclosure, the long axis K1 of the gate lines 102A, 102B, 102C and 102D (e.g. the gate line 102A) and the long axis K2 of the semiconductor fins 101A and 101B (e.g. the semiconductor fin 101A) may rather form an angle greater than 0° and less than 90° (not shown).

The bar-shaped contact structures 103 are respectively disposed adjacent to the two sides 101A1 and 101A2 of the semiconductor fin 101A and the two sides 101B1 and 101B2 of the semiconductor fins 101B parallel to the long axis K2 of the semiconductor fin 101A, but not overlapped with the semiconductor fin 101A and the semiconductor fins 101B. Each of the bar-shaped contact structures 103 is disposed between two adjacent gate lines (such as the adjacent two gate lines 102A and 102B), and arranged corresponding two adjacent gate lines (102A and 102B). In some embodiments of the preset disclosure, each of the bar-shaped contact structures 103 also has a long axis K3 forms an angle θ less than 0° and less than 90° with the long axis K1 of the two corresponding gate lines 102A and 102B. In the present embodiment, the angle θ formed by the long axis K3 of each bar-shaped contact structures 103 and the long axis K1 of the two corresponding gate lines 102A and 102B can be about 60°.

Although the long axis K3 of the bar-shaped contact structures 103, in the present embodiment, are parallel with each other, but the arrangement of the bar-shaped contact structures 103 may not be limited to this regard. In some embodiments of the present disclosure, one of the bar-shaped contact structures 103 may have a long axis forming an non-straight angle (which is not equal to 180° and 0°) with the long axis of another one of the bar-shaped contact structures 103 (not shown).

In some embodiments of the present disclosure, each of the bar-shaped contact structures 103 may at least partially cover on the two corresponding gate lines 102A and 102B. In the present embodiment, each of the bar-shaped contact structures 103 can thoroughly come across the two corresponding gate lines 102A and 102B. For example, the portion of the bar-shaped contact structures 103 overlapping with the gate line 102A may have a lateral width W11 measured along a direction perpendicular to the first direction (parallel to the extending direction of X axis) substantially equal to the length of a short axis S11 of the gate line 102A measured along the direction perpendicular to the first direction.

Figure 2A:
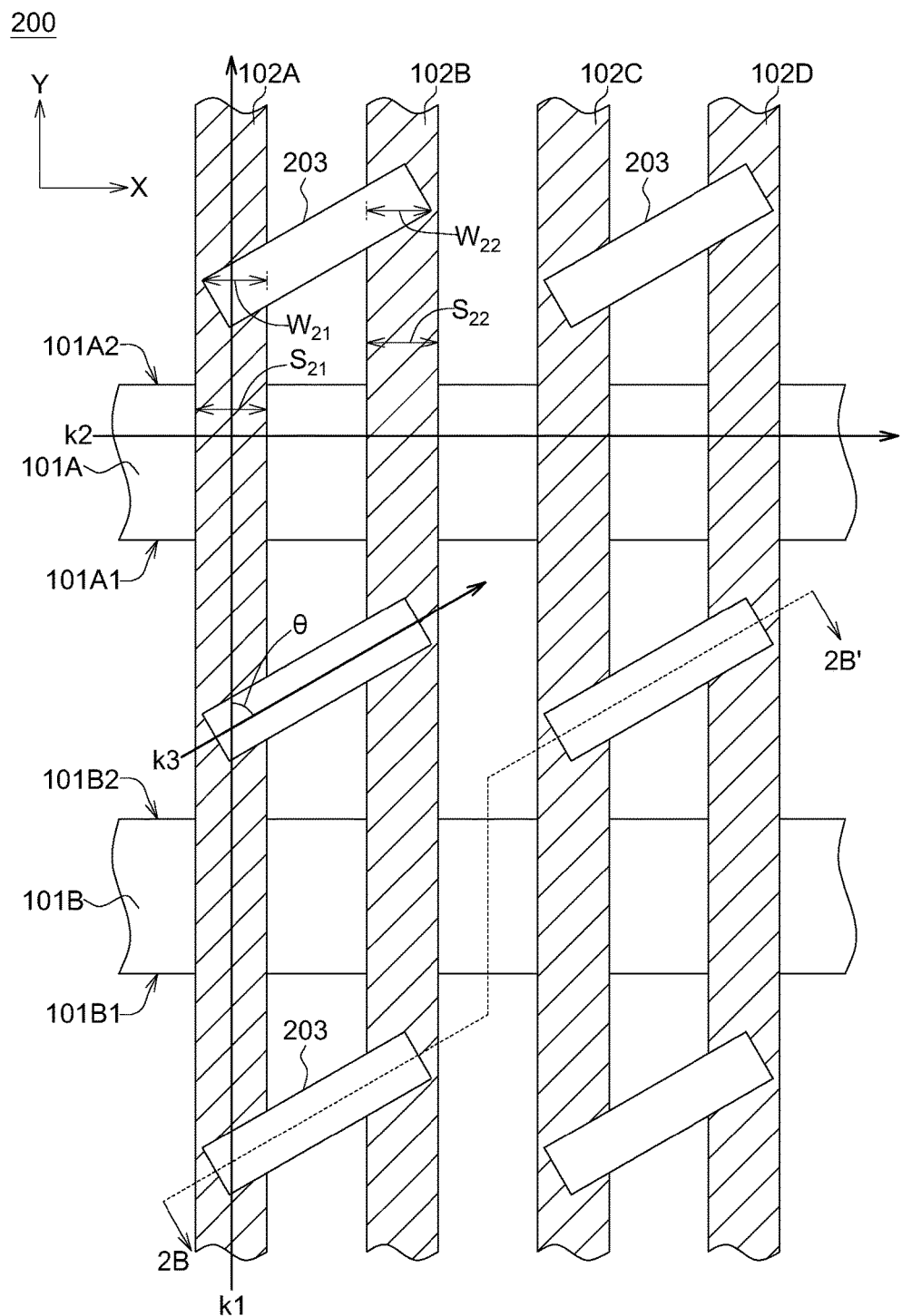
FIG. 2A is a top view illustrating a partial layout of a semiconductor device in accordance with another embodiment of the present disclosure.
Figure 2B:
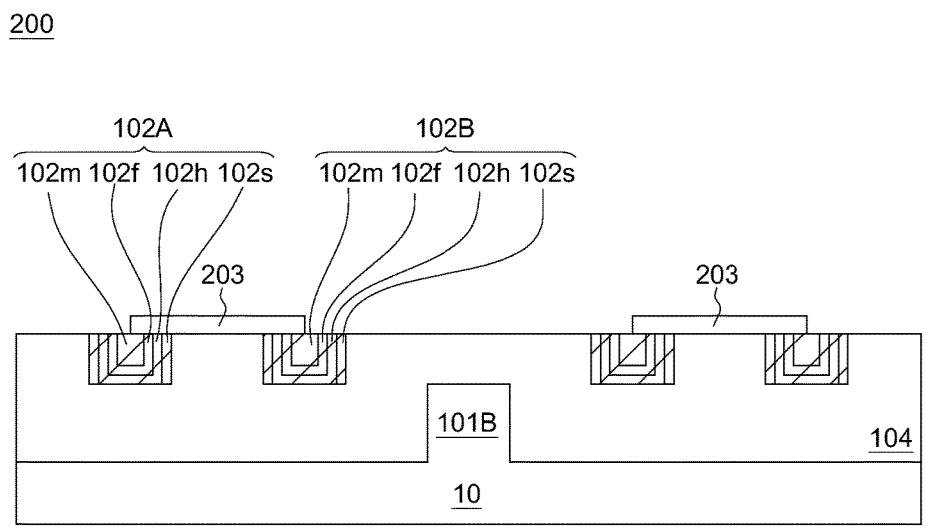
FIG. 2B is a cross-sectional view illustrating the structure of the semiconductor device taken along the section line 2B-2B' depicted in FIG. 2A.

However, the overlapping of the bar-shaped contact structures 103 and the two corresponding gate lines 102A and 102B may not limited to this regard. FIG. 2A is a top view illustrating a partial layout of a semiconductor device 200 in accordance with another embodiment of the present disclosure; and FIG. 2B is a cross-sectional view illustrating the structure of the semiconductor device 200 taken along the section line 2B-2B' depicted in FIG. 2A. The layout of the semiconductor device 200 is similar to that of the semiconductor device 100 except the arrangement of the bar-shaped contact structures 203 and the two corresponding gate lines 102A and 102B.

In the present embodiment, the portion of the bar-shaped contact structures 203 overlapping with the gate line 102A may have a lateral width W21 measured along a direction perpendicular to the first direction (parallel to the extending direction of X axis) substantially greater than half of the length of the short axis S11 of the gate line 102A measured along the direction perpendicular to the first direction; and the portion of the bar-shaped contact structures 203 overlapping with the gate line 102B may have a lateral width W22 measured along a direction perpendicular to the first direction (parallel to the extending direction of X axis) substantially greater than half of the length of the short axis S12 of the gate line 102B measured along the direction perpendicular to the first direction.

Figure 3A:
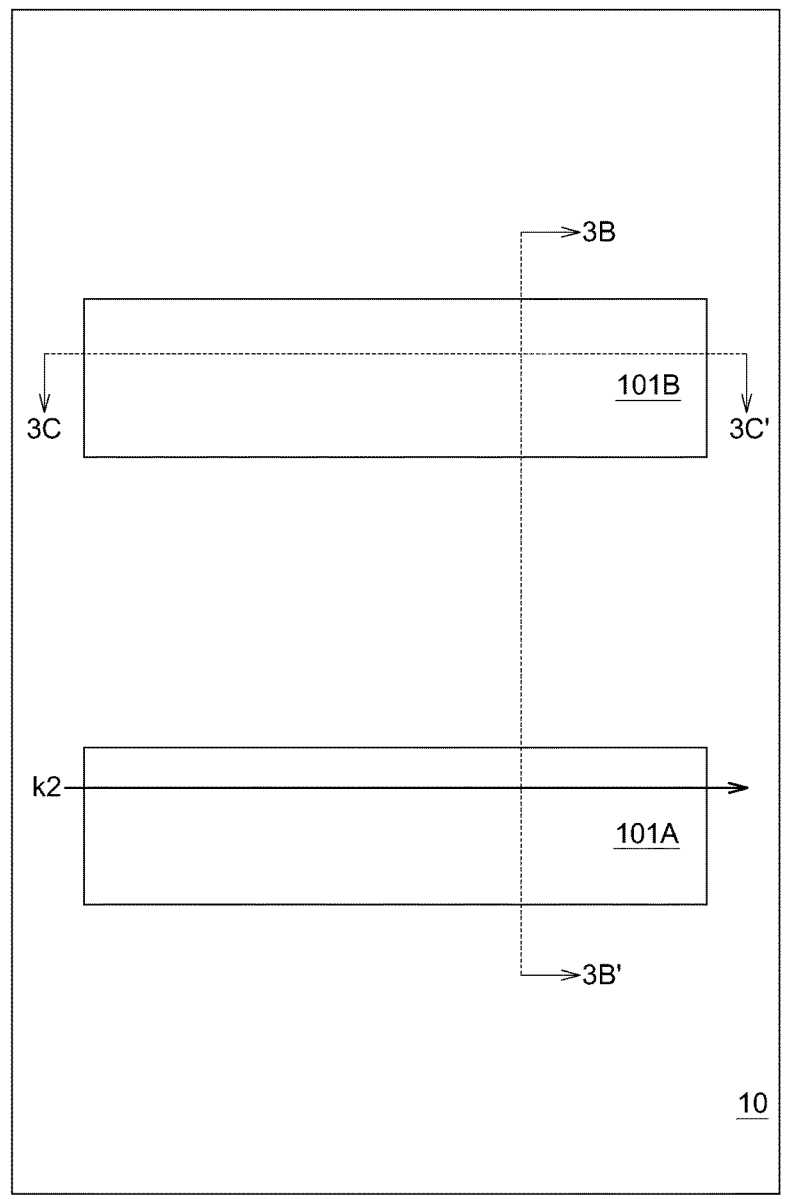
FIG. 3A is a top view illustrating the structure of a substrate with a plurality of semiconductor fins in accordance with one embodiment of the present disclosure.
Figure 3B:
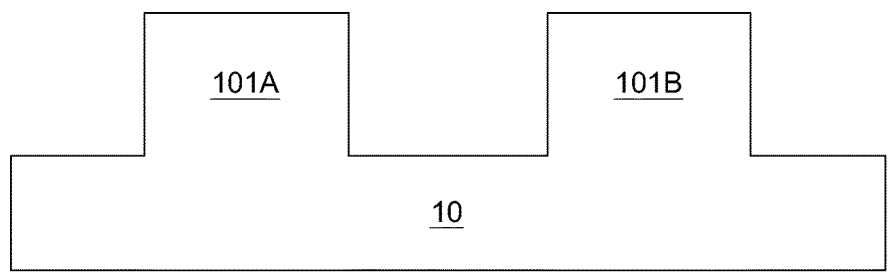
FIG. 3B is a cross-sectional view illustrating the structure of the substrate taken along the section line 3B-3B' depicted in FIG. 3A.
Figure 3C:
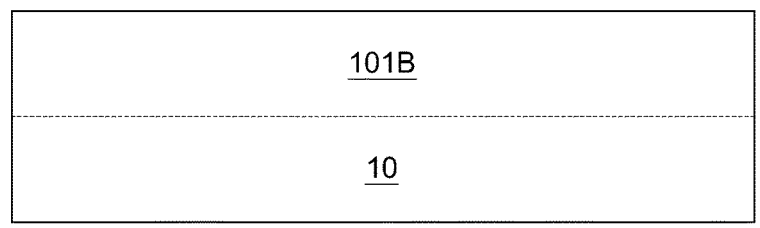
FIG. 3C is a cross-sectional view illustrating the structure of the substrate taken along the section line 3C-3C' depicted in FIG. 3A.

The method for fabricating the semiconductor device 100 may include steps as follows: A substrate 10 is firstly provided, and a plurality of semiconductor fins, such as the semiconductor fins 101A and 101B, are formed on the substrate 10. FIG. 3A is a top view illustrating the structure of a substrate 10 with a plurality of semiconductor fins 101A and 101B in accordance with one embodiment of the present disclosure; FIG. 3B is a cross-sectional view illustrating the structure of the substrate 10 taken along the section line 3B-3B' depicted in FIG. 3A; and FIG. 3C is a cross-sectional view illustrating the structure of the substrate taken along the section line 3C-3C' depicted in FIG. 3A.

In the present embodiment, the substrate 10 can be a silicon-containing substrate, such as a silicon wafer. Each of the semiconductor fins 101A and 101B can be mesa-stripes protruding form the top surface of the substrate 10 formed by an etching process. Each of the semiconductor fins 101A and 101B (e.g. the semiconductor fin 101A) has a long axis K2 extending along the extending direction of X axis (perpendicular to the first direction).

Figure 4A:
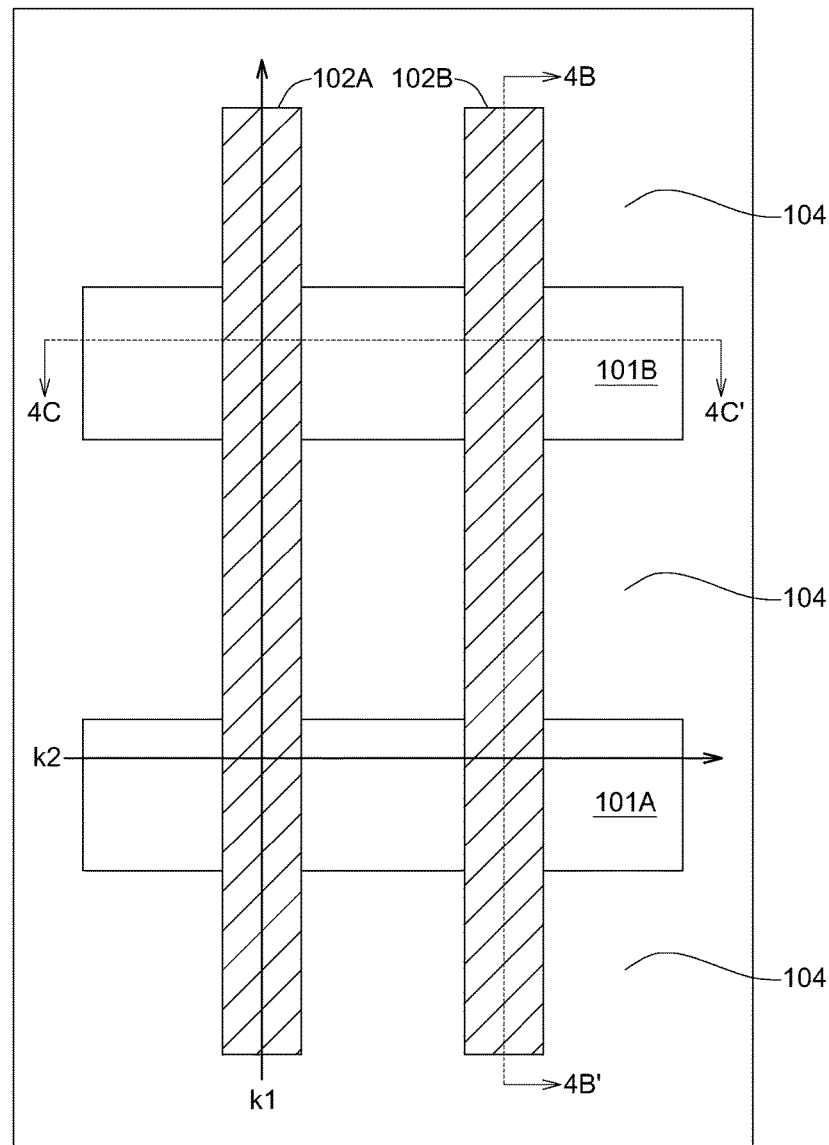
FIG. 4A is a top view illustrating the results after a plurality of gate lines are formed on the structure depicted on the FIG. 3A.
Figure 4B:
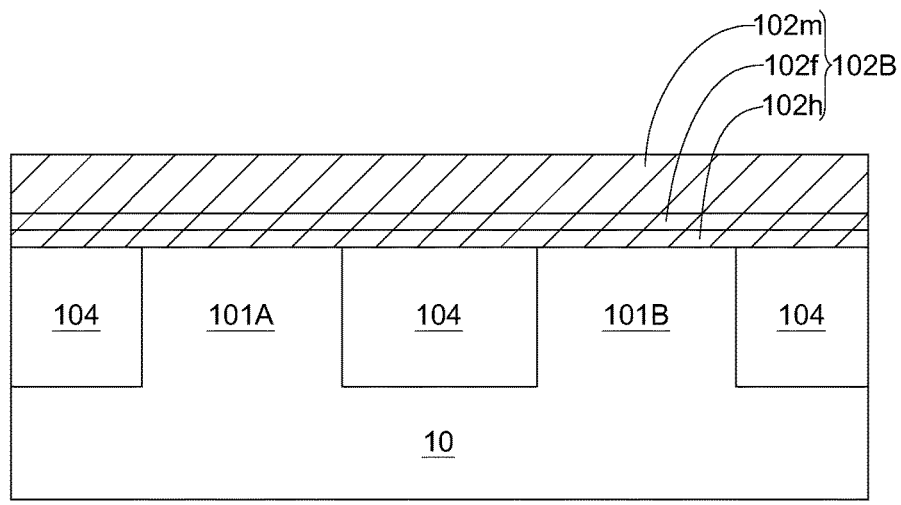
FIG. 4B is a cross-sectional view illustrating the structure taken along the section line 4B-4B' depicted in FIG. 4A.
Figure 4C:
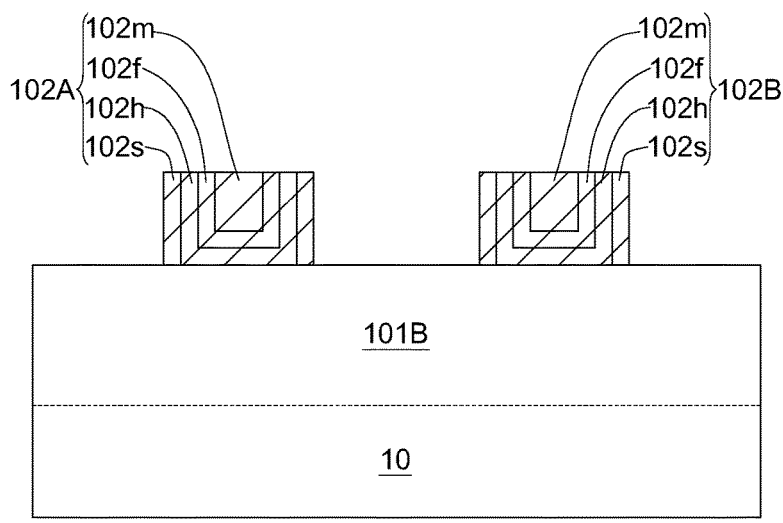
FIG. 4C is a cross-sectional view illustrating the structure taken along the section line 4C-4C' depicted in FIG. 4A.

Next, a plurality of gate lines 102A and 102B are formed coming across over the semiconductor fins 101A and 101B. FIG. 4A is a top view illustrating the results after a plurality of gate lines (such as the gate lines 102a and 102B) are formed on the structure depicted on the FIG. 3A; FIG. 4B is a cross-sectional view illustrating the structure taken along the section line 4B-4B' depicted in FIG. 4A; and FIG. 4C is a cross-sectional view illustrating the structure taken along the section line 4C-4C' depicted in FIG. 4A. In the present embodiment, the gate lines 102a and 102B may conformally come across over the semiconductor fins 101A and 101B; and each of the gate lines 102a and 102B (e.g. the gate line 102a) has a long axis K1 extending along the extending direction of Y axis (parallel to the first direction). In some embodiments of the present embodiments, the gate lines 102a and 102B may include metal material. For example, in the present embodiment, each of the gate lines 102a and 102B may include a high-k/metal gate. In detail, each of the gate lines 102a and 102B may include a gate spacer 102s, a high dielectric constant material (high-k) layer 102h, a work function layer 102f and a metal gate 102m. An insulation structure 104, such as a shallow trench isolation (STI), may be formed between the two adjacent gate lines 102a and 102B.

Figure 5A:
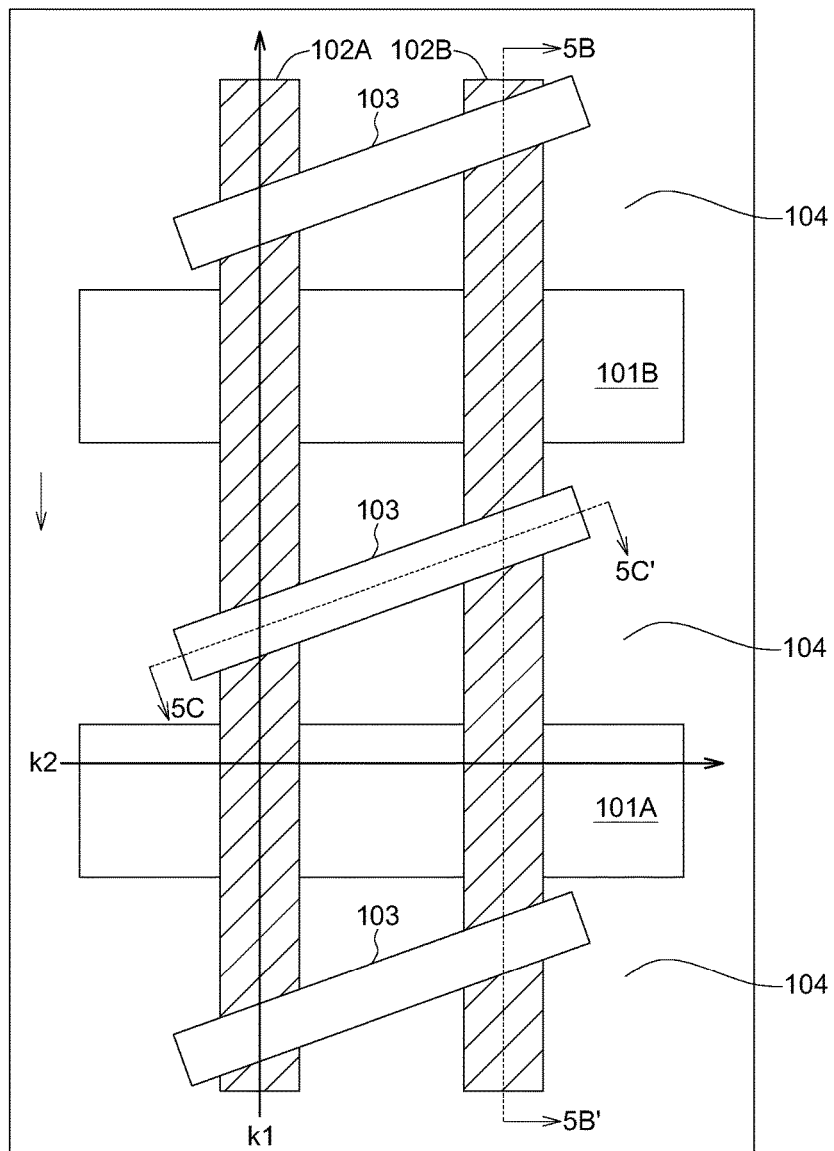
FIG. 5A is a top view illustrating the results after a plurality of bar-shaped contact structures are formed on the structure depicted on the FIG. 4A.
Figure 5B:
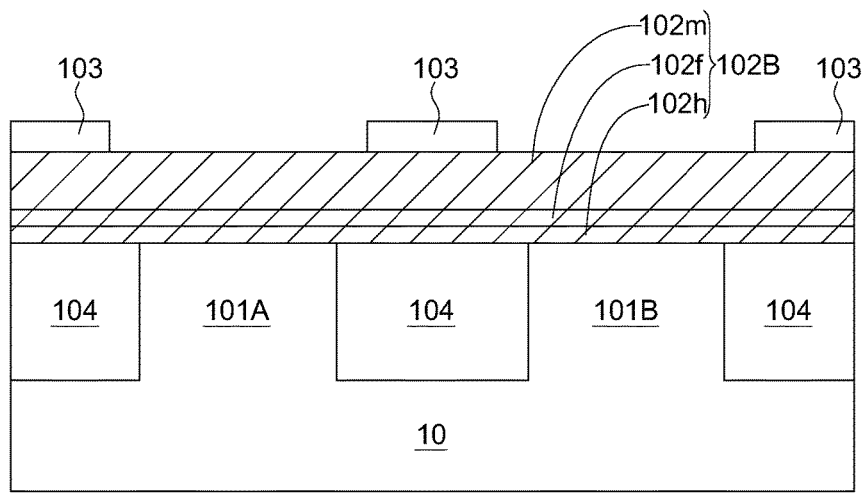
FIG. 5B is a cross-sectional view illustrating the structure taken along the section line 5B-5B' depicted in FIG. 5A.
Figure 5C:
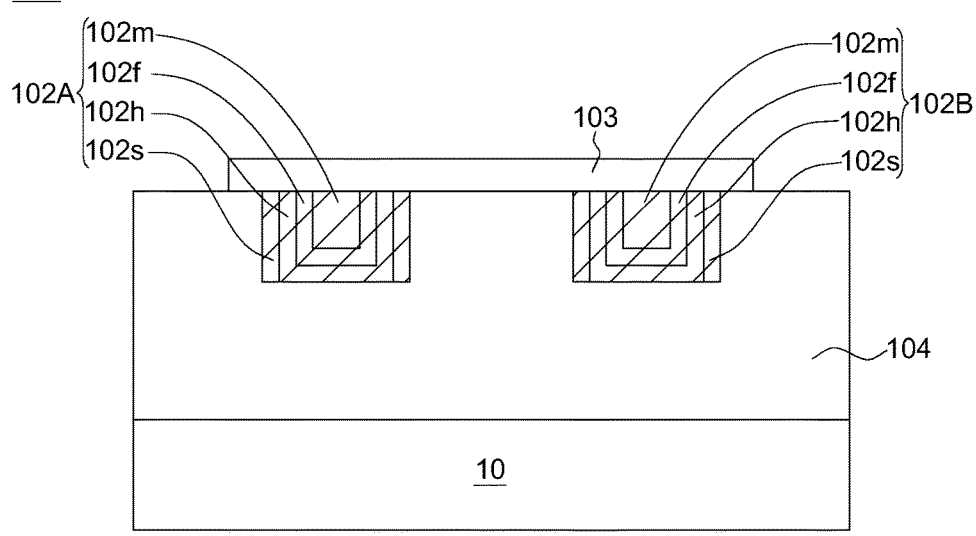
FIG. 5C is a cross-sectional view illustrating the structure of the taken along the section line 5C-5C' depicted in FIG. 5A.

A plurality of bar-shaped contact structures 103 are then provided. FIG. 5A is a top view illustrating the results after a plurality of bar-shaped contact structures 103 are formed on the structure depicted on the FIG. 4A; FIG. 5B is a cross-sectional view illustrating the structure taken along the section line 5B-5B' depicted in FIG. 5A; and FIG. 5C is a cross-sectional view illustrating the structure of the taken along the section line 5C-5C' depicted in FIG. 5A. In some embodiments of the present disclosure, each of the bar-shaped contact structures 103 is formed on the insulation structure 104 disposed between the two adjacent gate lines 102a and 102B, extending beyond the insulation structure 104 to cover on a portion of the gate lines 102a and 102B, and electrically contacting with the gate lines 102a and 102B respectively. Each of the bar-shaped contact structures 103 has a long axis K3 forming an angle θ less than 0° and less than 90° with the long axis K1 of the two corresponding gate lines 102A and 102B. In the present embodiment, each of the bar-shaped contact structures 103 may at least partially cover on the two corresponding gate lines 102A and 102B.

Because the long axis K3 of the bar-shaped contact structures 103 and the long axis K1 of the two corresponding gate lines 102A and 102B form an angle θ less than 0° and less than 90° instead of a right angle. The overlapping area defined by the bar-shaped contact structures 103 and the two corresponding gate lines 102A and 102B can be enlarged to provide more space for forming an electrical contact respectively between the bar-shaped contact structures 103 and the two corresponding gate lines 102A and 102B, so as to expend the process window for forming the semiconductor device 100 without increase the pitch (width) of these two gate lines 102A and 102B. As a result, the yield and reliability of the semiconductor device 100 can be significantly improved.

In accordance with the aforementioned embodiments of the present disclosure, a semiconductor device is provided in which a bar-shaped contact structure is applied electrically contacting to two parallel gate lines underlying thereof, wherein the bar-shaped contact structure has a long axis forming an angle greater than 0° and less than 90° with the long axis of the two parallel gate lines respectively. By this arrangement, the contacting area of the contact structure landing on the top surfaces of these two gate lines can be enlarged without increasing the pitch (width) of these two gate lines. As a result, the connection reliability between the bar-shaped contact structure and these two gate lines can be improved and the yield of the semiconductor device can be also increased.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device comprising:
    a first gate line, having a first long axis extending along a first direction;
    a second gate line, parallel to the first gate line;
    a first bar-shaped contact structure, having a second axis forming an angle substantially greater than 0° and less than 90° with the first long axis, wherein the first bar-shaped contact structure at least partially covers on the first gate line and the second gate line;
    a first semiconductor fin, having a third long axis perpendicular to the first direction and overlapping with the first gate line and the second gate line, and
    a second semiconductor fin, parallel to and adjacent to the first semiconductor fin and overlapping with the first gate line and the second gate line,
    wherein the first bar-shaped contact structure is completely disposed on a portion of an insulation structure disposed between the first semiconductor fin and the second semiconductor fin.

2. The semiconductor device according to claim 1, wherein a portion of the first bar-shaped contact structure overlapping with the first gate line has a first lateral width measured along a direction perpendicular to the first direction; and the first lateral width is substantially greater than half of a length of a short axis of the first gate line measured along the direction perpendicular to the first direction.

3. The semiconductor device according to claim 2, wherein the first lateral width is equal to the length of the short axis of the first gate line.

4. The semiconductor device according to claim 3, wherein a portion of the first bar-shaped contact structure overlapping with the second gate line has a second lateral width measured along a direction perpendicular to the first direction; and the second lateral width is substantially greater than half of a length of a short axis of the second gate line measured along the direction perpendicular to the first direction.

5. The semiconductor device according to claim 4, wherein the second lateral width is equal to the length of the short axis of the second gate line.

6. The semiconductor device according to claim 1, wherein the first bar-shaped contact structure thoroughly comes across over the first gate line and the second gate line that are disposed adjacent to each other.

7. The semiconductor device according to claim 1, further comprising a second bar-shaped contact structure having a fourth long axis, wherein the fourth long axis and the first long axis form an angle substantially greater than 0° and less than 90°; the first bar-shaped contact structure and the second bar-shaped contact structure are respectively disposed adjacent to two opposite ends of one of the first semiconductor fin and the second semiconductor fin; and the second bar-shaped contact structure is not overlapped with the first semiconductor fin and the second semiconductor fin; the first bar-shaped contact structure at least partially covers on the first gate line and the second gate line; and the second bar-shaped contact structure at least partially covers on the first gate line and the second gate line.

8. A semiconductor device comprising:
a semiconductor substrate;
a first gate line, disposed on the substrate and having a first long axis extending along a first direction;
a second gate line, disposed on the substrate and parallel to the first gate line;
a first bar-shaped contact structure, coming across over and electrically contacting to the first gate line and the second gate line, as well as having a second axis forming an angle substantially greater than 0° and less than 90° with the first long axis;
a first semiconductor fin, having a third long axis perpendicular to the first direction and overlapping with the first gate line and the second gate line, and
a second semiconductor fin, parallel to and adjacent to the first semiconductor fin and overlapping with the first gate line and the second gate line,
wherein the first bar-shaped contact structure is completely disposed on a portion of an insulation structure disposed between the first semiconductor fin and the second semiconductor fin.

9. The semiconductor device according to claim 8, wherein the first bar-shaped contact structure at least partially contacts to top surfaces of the first gate line and the second gate line respectively.

10. The semiconductor device according to claim 9, wherein a portion of the first bar-shaped contact structure overlapping with the first gate line has a first lateral width measured along a direction perpendicular to the first direction; and the first lateral width is substantially greater than half of a length of a short axis of the first gate line measured along the direction perpendicular to the first direction.

11. The semiconductor device according to claim 10, wherein the first lateral width is equal to the length of the short axis of the first gate line.

12. The semiconductor device according to claim 11, wherein a portion of the first bar-shaped contact structure overlapping with the second gate line has a second lateral width measured along a direction perpendicular to the first direction; and the second lateral width is substantially greater than half of a length of a short axis of the second gate line measured along the direction perpendicular to the first direction.

13. The semiconductor device according to claim 12, wherein the second lateral width is equal to the length of the short axis of the second gate line.

14. The semiconductor device according to claim 9, wherein the first bar-shaped contact structure thoroughly comes across over the first gate line and the second gate line that are disposed adjacent to each other.

15. The semiconductor device according to claim 8, wherein the first semiconductor fin and the second semiconductor fin are disposed under the first gate line and the second gate line.

16. The semiconductor device according to claim 8, further comprising a second bar-shaped contact structure having a fourth long axis, wherein the fourth long axis and the first long axis form an angle substantially greater than 0° and less than 90°; the first bar-shaped contact structure and the second bar-shaped contact structure are respectively disposed adjacent to two opposite ends of one of the first semiconductor fin and the second semiconductor fin; the second bar-shaped contact structure is not overlapped with the first semiconductor fin and the second semiconductor fin; the first bar-shaped contact structure at least partially covers on the first gate line and the second gate line; and the second bar-shaped contact structure at least partially covers on the first gate line and the second gate line.

17. The semiconductor device according to claim 15, wherein
the portion of the insulation structure further comprises a shallow trench isolation (STI) formed under the first bar-shaped contact structure and between the first gate line and the second gate line.

\* \* \* \* \*